United States Patent
Walker

(10) Patent No.: US 7,554,378 B2
(45) Date of Patent: Jun. 30, 2009

(54) FAST DC COUPLED LEVEL TRANSLATOR

(75) Inventor: James T. Walker, Palo Alto, CA (US)

(73) Assignee: Supertex, Inc., Sunnyvale, CA (US)

( * ) Notice: Subject to any disclaimer, the term of this patent is extended or adjusted under 35 U.S.C. 154(b) by 0 days.

(21) Appl. No.: 11/766,701

(22) Filed: Jun. 21, 2007

(65) Prior Publication Data

US 2008/0024187 A1 Jan. 31, 2008

Related U.S. Application Data

(60) Provisional application No. 60/820,266, filed on Jul. 25, 2006.

(51) Int. Cl.
*H03L 5/00* (2006.01)
*H03K 5/22* (2006.01)

(52) U.S. Cl. ............... 327/322; 327/306; 327/50

(58) Field of Classification Search ........... 327/50, 327/66, 77, 306, 322, 333
See application file for complete search history.

(56) References Cited

U.S. PATENT DOCUMENTS 5,025,177 A * 6/1991 Mounger ............ 327/65

* cited by examiner

*Primary Examiner*—Dinh T. Le
(74) *Attorney, Agent, or Firm*—Jeffrey D. Moy; Weiss & Moy, P.C.; Supertex, Inc.

(57) ABSTRACT

A level translator has an inverter comprising a first transistor having a first predetermined voltage threshold and a second transistor having a second predetermined voltage threshold. The two transistors have control gates being of complementary conductivity. A first capacitor is connected at one end to the gate of the first transistor and at a second end to an input signal. A second capacitor is connected at one end to the gate of the second transistor, the input signal being applied to a second end of the second capacitor. A comparator is used for detecting the relationship between the input signal and a reference voltage. A first current mirror has one terminal connected to an output of the comparator, and another terminal connected to the gate of the first transistor. A second current mirror has one terminal connected to an output of the comparator, and another terminal connected to the gate of the second transistor. A first clamp circuit is used for limiting a gate voltage of said first transistor. A second clamp circuit is used for limiting a gate voltage of said second transistor.

19 Claims, 4 Drawing Sheets

PCLAMP CIRCUIT a) IDEAL  B) PRACTICAL

NCLAMP CIRCUIT a) IDEAL  B) PRACTICAL

FAST DC COUPLED LEVEL TRANSLATOR

RELATED APPLICATION

This application is related to U.S. Provisional Application Ser. No. 60/820,266, filed Jul. 25, 2006, in the name of the same inventor listed above, and entitled, "A FAST DC COUPLED LEVEL TRANSLATOR". The present patent application claims the benefit under 35 U.S.C. §119(e).

FIELD OF THE INVENTION

This invention relates to level translators and, more specifically, to a high speed DC coupled logic level translator that is useful for high speed, high current CMOS drivers used for applications such as medical ultrasound and non-destructive testing, where MOSFET power transistors must be driven quickly with signals originating in low voltage logic circuits. Additional applications in switch mode power supplies and other circuits requiring the fast switching of MOSFET power transistors are possible.

BACKGROUND OF THE INVENTION

The growth of digital ICs that feature incompatible voltage rails, lower voltage rails, or dual rails has made the translation of logic levels necessary. The use of mixed-signal ICs with lower supply voltages that have not kept pace with those of their digital counterparts also creates the also creates the need for logic-level translation.

Because of the above problems, logic level translators have been designed. Logic level translators are able to adapt or convert one voltage or logic level to another. Logic level translators are generally used in devices that operate at multiple voltage levels. Devices that often use logic level translators include microprocessors and integrated circuits that have inputs and outputs functioning at 1.8 volts and logic levels for flash memory or panel display requiring 3.3 volts. These mismatched voltages can be mitigated between the integrated circuit (IC) and the device by using the logic level translator.

Presently there is a need for a high speed AC coupled logic level translator. A high speed AC coupled logic level translator would be particularly useful for high speed, high current CMOS drivers used for applications where MOSFET power transistors must be driven quickly with signals originating in low voltage logic circuits. The capability is provided for enabling the fast digital signal to cross over a high voltage barrier between two different supply voltage groups and still retain its signal transition speeds.

Therefore, a need existed to provide a device and method that provides the above features.

SUMMARY OF THE INVENTION

A level translator has an inverter comprising a first transistor having a first predetermined voltage threshold and a second transistor having a second predetermined voltage threshold. The two transistors have control gates being of complementary conductivity. A first first capacitor is connected at one end to the gate of the first transistor and at a second end to an input signal. A second capacitor is connected at one end to the gate of the second transistor, the input signal being applied to a second end of the second capacitor. A comparator is used for detecting the relationship between the input signal and a reference voltage. A first current mirror has one terminal connected to an output of the comparator, and another terminal connected to the gate of the first transistor. A second current mirror has one terminal connected to an output of the comparator, and another terminal connected to the gate of the second transistor. A first clamp circuit is used for limiting a gate voltage of said first transistor. A second clamp circuit is used for limiting a gate voltage of said second transistor.

The present invention is best understood by reference to the following detailed description when read in conjunction with the accompanying drawings.

DETAILED DESCRIPTION

Figure 1:
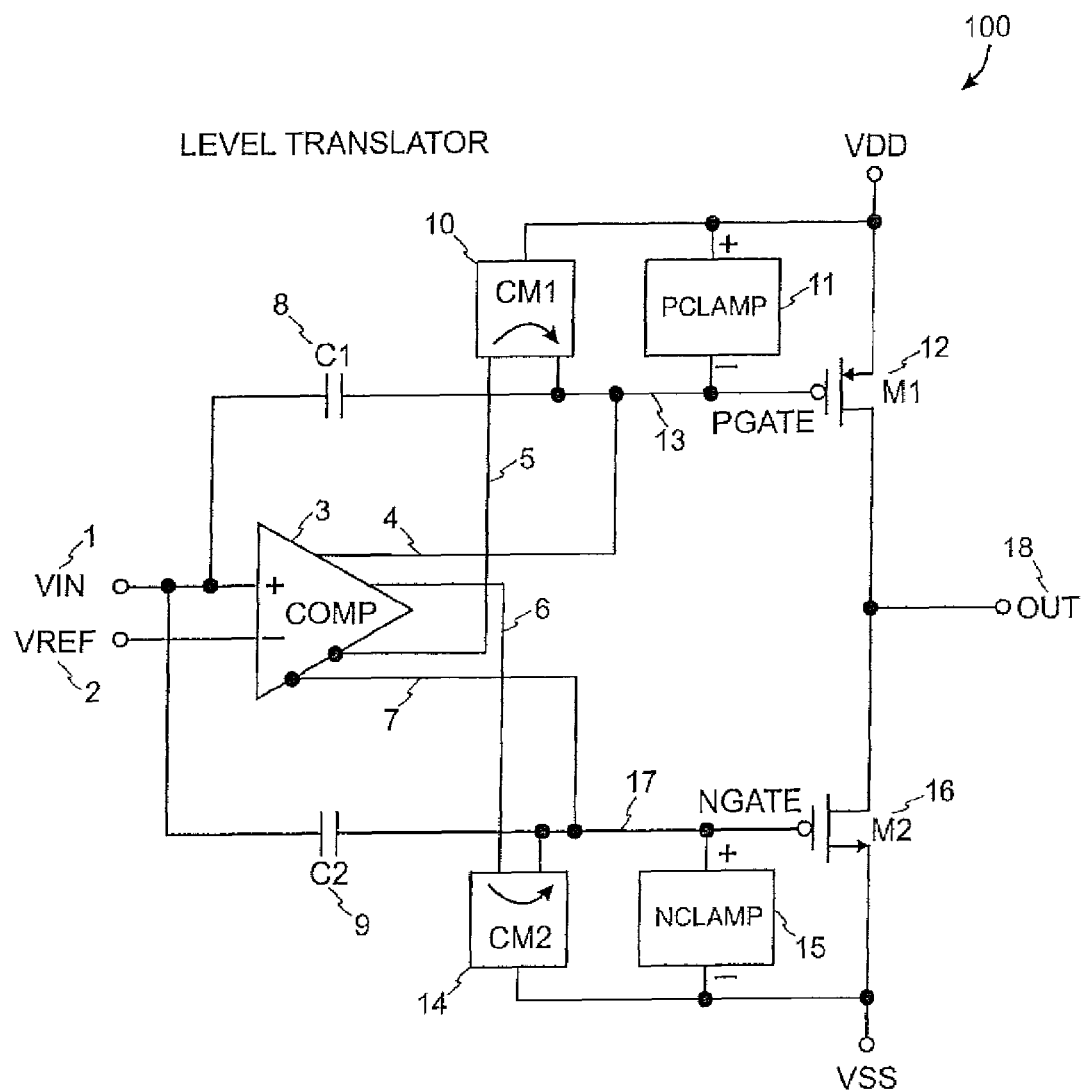
FIG. 1 is a simplified functional block diagram of a level translator of the present invention.

Referring FIG. 1, a simplified schematic of one embodiment of a fast level translator 100 is shown. The translator 100 has an input signal VIN at 1. VIN has a typical voltage swing of 0 to 1.8 volts. A reference voltage VREF of value chosen to be in the middle of the range of the inputs on VIN is applied to node 2. These voltages are compared by comparator 3 to determine which is larger. The comparator COMP denoted 3 is generally made using NMOS and PMOS transistors as is known in the state of the art. The comparator 3 has two sets of current outputs 4, 5 and 6, 7. The output 4 sinks current if the input signal VIN is greater than VREF, and the output 5 sinks current if the input signal VIN is less than VREF. In a similar manner, the output 6 sources current if the input signal VIN is greater than VREF, and the output 7 sources current if the input signal VIN is less than VREF. Each of the signal current pairs 4, 5 and 6, 7 represents a differential current, with one being larger than the other depending on the level of the input signal. The differential currents discussed above are used to convey information about the low frequency and DC state of the input signal VIN to the remainder of the circuit.

Consider now the differential currents 4 and 5. A current mirror CM 1 denoted 10 is used to reverse the direction of current flow derived from 5, so that the difference between the currents 4 and 5 may be obtained at the circuit node 13. This current mirror 10 may be made with a pair of PMOS transistors as is known in the state of the art. Node 13 then will tend to go to a higher to go to a higher voltage if the input voltage VIN is less than VREF, and a lower voltage if VIN is greater than VREF. This change of voltage is then applied to the gate of a PMOS transistor M1 denoted 12 to control its output current. Therefore when the input signal VIN is less than VREF, transistor 12 is off or non-conducting, and when VIN is greater than VREF, transistor 12 is on or conducting.

In a like manner, consider now the differential currents 6 and 7. A circuit similar to the above but with opposite polarity uses current mirror CM2 denoted 14 to take the difference of the currents 6, 7 at node 17. Current mirror 14 may be made using NMOS transistors as is known in the state of the art. The resultant voltage swings at node 17 are used to control the output current of transistor M2 denoted 16. Node 17 will go to a higher voltage if VIN is less than VREF, and a lower voltage if VIN is greater than VREF. Therefore transistor 16 will turn on if VIN is less than VREF, and off if VIN is greater than VREF.

The operation of the portion of the circuit incorporating current mirror 14 and transistor 16 is complementary to the operation of the circuit using current mirror 10 and transistor 12. As a result, when VIN is less than VREF, transistor 16 is on and transistor 12 is off. This holds the output node 18 at the voltage VSS. Conversely, when VIN is greater than VREF, transistor 16 is off and transistor 12 is on. This holds the output node at the voltage VDD. The output levels will be modified if there is current flowing in the transistors 12 and 16 due to external current into or out of node 18, but the circuit operation remains essentially the same. The result of the circuit operation is that the output voltage 18 follows the changes in the voltage at VIN, with an amplitude defined by VSS and VDD. The speed of changes is limited by the input signal transition speed, the by the input signal transition speed, the properties of transistors 12 and 16, and the external circuit loading on node 18.

Since the outputs 4, 5 of the comparator 3 and the current mirror 10 have a high impedance, the voltage swing at node 13 could become too large for proper operation of transistor 12. Excessive voltage swing could even result in damage of transistor 12. Prevention of excessive voltage swing at 13 is done by adding a voltage clamp PCLAMP denoted 11. This clamp circuit 11 has the property that if the voltage across its terminals exceeds a predetermined value, it will conduct current, thereby limiting the voltage swing at node 13. When the voltage across its terminals is less than the predetermined value, it does not conduct significant current.

Figure 2:
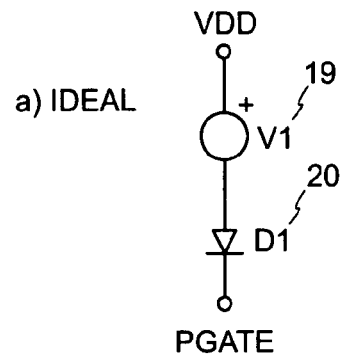
FIGS. 2a-2b shows simplified functional block diagrams of a P-Clamp circuit used in the level translator of the present invention.
Figure 2:
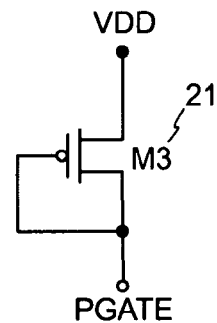

FIG. 2a shows a circuit representation of the clamp 11. In this circuit 11, a voltage source V1 denoted 19 is used in series with a diode D1 denoted 20. For differential terminal voltages (VDD−PGATE) less than V1, the circuit 11 will conduct no significant current, for differential terminal voltages (VDD−PGATE) greater than V1, the circuit 11 will conduct a current sufficient to limit the differential voltage to the value of the voltage source 19. In a practical circuit realization, it is convenient to replace the circuit 11 of FIG. 2a with a device which may be easily integrated into a monolithic circuit. FIG. 2b shows one method using a PMOS transistor M3, denoted 21. The transistor 21 is connected with its gate tied to its drain, so that the value of drain to source voltage controls the drain current. In this way, the transistor 21 serves as a clamping device to limit the voltage excursion at the circuit node 13 of FIG. 1. The above is given as examples, other means known to the state of the art may be used to fabricate alternative clamps without fabricate alternative clamps without departing from the spirit and scope of the present invention.

Figure 3:
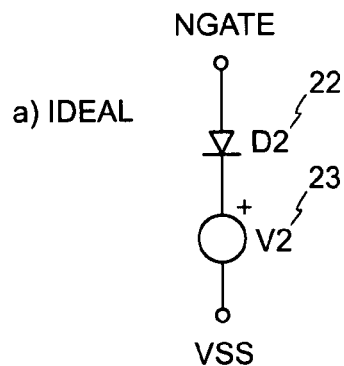
FIGS. 3a-3b shows simplified functional block diagrams of an N-Clamp circuit used in the level translator of the present invention.
Figure 3:
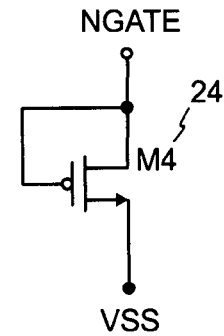

The circuit connected to node 17 in FIG. 1 requires a clamp circuit NCLAMP denoted 15 with opposite polarity compared to that of clamp circuit 11. FIG. 3a shows a circuit representation of the clamp 15. In this case, a diode D2 denoted 22 is shown in series with a voltage source V2 denoted 23. A device configuration similar to FIG. 2a could have been used instead, but the circuit of FIG. 3a is shown to stress the complementary structure desired in a practical realization of clamp 15. In a manner similar to clamp 11, a practical realization of clamp 15 may be done with an NMOS transistor M4 denoted 24 connected as shown in FIG. 3b. The transistor gate is connected to its drain as before, so that voltage present at node 17 will cause conduction in transistor 24, limiting the voltage swing at node 17. Other alternative clamps may be used as known in the state of the art without departing from the spirit and scope of the present invention.

Referring back to FIG. 1, the overall result of the comparator 3, mirrors 10 and 14, and clamps 11 and 15 is to provide proper gate drive of transistors 12 and 16 for DC and low frequencies. In this way the output at node 18 will have a proper correspondence to the input VIN at DC and low frequencies. In addition to providing amplification of the input signal VIN to the output at node 18, the circuit 100 always has proper a DC state at its output. This is in contrast to an AC coupled amplifier, which may be simpler but cannot transmit DC information.

High speed operation of the circuit 100 in FIG. 1 is facilitated by the addition of capacitors C1, denoted 8, and C2, denoted 9. Capacitor 8 provides a low impedance path at high frequencies from the input voltage VIN to the gate of transistor 12 at the node 13. Therefore fast Therefore fast changes in the voltage at VIN are directly conveyed to transistor 12, providing faster circuit response. The inherent time delay of the comparator 3 and mirror 10 are circumvented by this expediency so that the circuit transient response is determined primarily by transistor 12 and the load present on its drain node 13. In a like manner, capacitor 9 provides a low impedance path at high frequencies from the input voltage VIN to the gate of transistor 16 at node 17. Therefore fast changes in the voltage at VIN are also directly conveyed to transistor 16, once more circumventing the inherent delay of comparator 3 and mirror 14.

Since the gates of transistors 12 and 16 are directly driven by the capacitors 8 and 9 at high frequencies, and indirectly at DC and low frequencies by comparator 3, mirrors 10 and 14, and clamps 11 and 15, the output 18 is a good representation of the state of the input VIN at all frequencies. The only circuit limitation as to speed is the response time of transistors 12 and 16, together with any circuit resistive or capacitive loading present at the output node 18. In some applications, it may be expedient to reduce the loading on the output of the circuit at node 18 by addition of logic inverters as digital amplifiers between the output node 18 and further circuitry as known in the state of the art.

Figure 4:
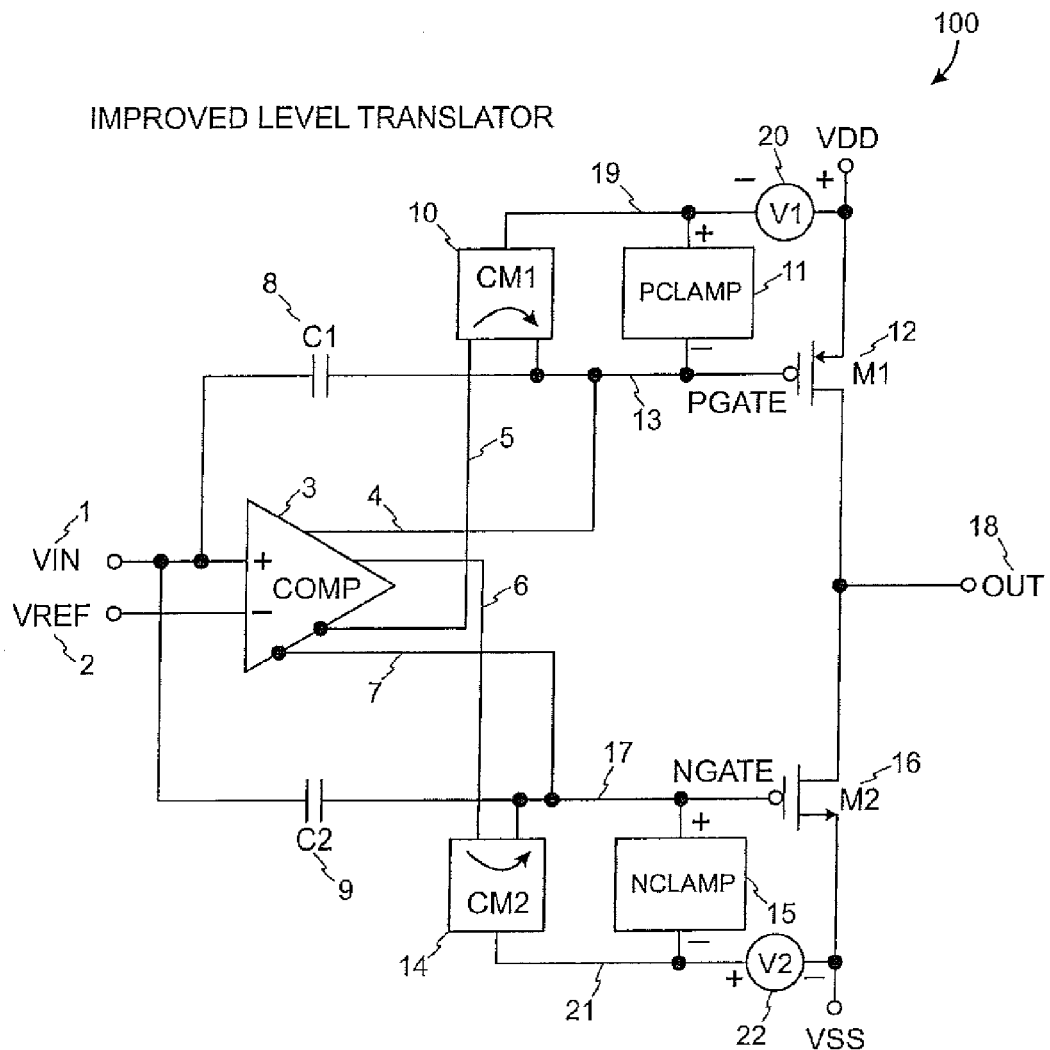
FIG. 4 is a simplified functional block diagram of a level translator of the present invention with compensating voltage sources.

FIG. 4 shows an important improvement to the level translator circuit 100 of FIG. 1. During normal operation, most MOS current mirror circuits have minimal voltage drop when the load does not draw the amount of current which the mirror is trying to produce. Referring again to the circuit 100 of FIG. 1, when there is only a small current being sunk by the output 4 of comparator 3, node 13 will tend to go to a voltage equal to VDD. Therefore the voltage on node 13 swings from VDD when transistor 12 is off, to a value set by the comparator sink current 4 and the sink current 4 and the clamp 11 when transistor 12 is on. In a similar manner, when there is only a small current being sourced by the output 7 of comparator 3, node 17 will tend to go to a voltage equal to VSS. Therefore the voltage on node 17 swings from VSS when transistor 16 is off, to a value set by the comparator source current 7 and the clamp 15 when transistor 16 is on.

The voltage swings on nodes 13 and 17 are more than needed for proper operation of transistors 12 and 16. The excessive voltage swing reduces the sensitivity of the circuit 100 and causes its operation to be slower than otherwise possible. Part of the reason for this effect is that the transistors 12 and 16 have a minimum gate—source voltage for conduction to occur, known in the state of the art as the threshold voltage. Two possible methods for reduction of the required voltage swing are to either modify the properties of the transistors 12 and 16 to reduce their threshold voltage, or to provide a compensating source of voltage so that the transistors 12 and 16 are kept at a value of gate—source voltage near their threshold voltage when off.

Figure 5A:
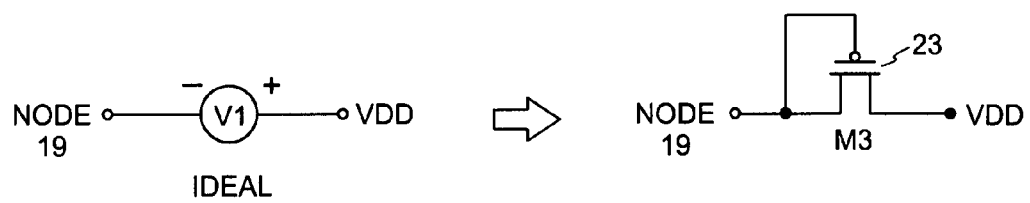
FIGS. 5a-5b show simplified functional block diagram of the compensating voltage sources used in the level translator of the present invention.
Figure 5B:
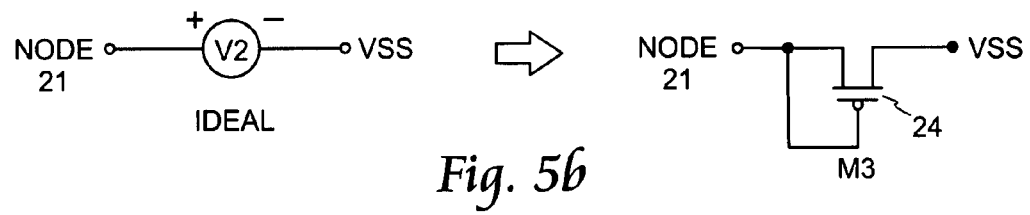

Modification of the properties of the transistors is usually not desirable, since it requires additional steps in the fabrication process, and may not be compatible with other devices in the integrated circuit. Use of a compensating voltage source voltage is a good solution, providing that the voltage can be reliably made similar to the requirements of the transistors 12 and 16. FIGS. 5a and 5b show one means of achieving this goal. In FIG. 5a, the voltage source V1 is replaced with a PMOS transistor with its gate connected to its drain. This diode connected transistor M3, denoted 23, has its size chosen so that the voltage dropped across it is just sufficient to turn on the output transistor 12 at a low value of current. In a similar manner, FIG. 5b shows the FIG. 5b shows the voltage source V2 replaced with an NMOS transistor with its gate connected to its drain. This diode connected transistor M4, denoted 24, has its size chosen so that the voltage dropped across it is just sufficient to turn on the output transistor 16 at a low value of current.

Referring again to FIG. 4, the differential outputs 4 and 5 of comparator 3 have the general property that the sum of their currents is essentially constant. These currents flow either through current mirror 10 or clamp 11, with the result that the current flowing through voltage source 20 is essentially constant in the steady state. Therefore use of a diode connected transistor for source 20 works correctly, since its drain current is relatively constant. The additional advantage is obtained that if transistors 12 and 23 are fabricated in a similar manner, their threshold voltages will track with changes in the processing conditions, device temperatures, and other influences. Therefore the voltage developed by transistor 23 will be optimum for proper circuit operation. The required voltage swing at node 13 is reduced by the amount of the threshold voltage of transistor 23, and the input signal sensitivity is increased.

In a similar manner, the sum of the currents 6 and 7 flow through voltage source 22, so use of transistor 24 for this function gives the same type of benefits. The voltage developed by transistor 24 is optimum for proper operation of output transistor 16 if fabricated in a similar manner. The overall result of the addition of transistors 23 and 24 is that the sensitivity and speed of the level translator are substantially improved. Reduced voltage swings at nodes 13 and 17 give faster operation for the circuit.

The circuit 100 is particularly useful for high speed, high current CMOS drivers used used for applications such as medical ultrasound and non-destructive testing, where MOSFET power transistors must be driven quickly with signals originating in low voltage logic circuits. Additional applications in switch mode power supplies and other circuits requiring the fast switching of MOSFET power transistors are possible.

The level translator 100 accepts an input signal typically taking on the values of logic low near 0 V and logic high near 1.8 volts, and converts them to a CMOS logic voltage swing at a higher supply voltage of 5 to 12 volts. Input voltage swings of 1.2 volts or less may be used in practice, with the same circuitry being useful for an input logic swing of 1.2 to 5.0 volts, for example. This circuit 100 may be adapted to other supply voltage combinations by generalization of the operating principle.

Two separate information paths are utilized to permit optimum signal handling for the low frequency and high frequency components of the input signal being translated. The combination permits correct operating for signals from DC and an arbitrary low frequency range to high frequencies of up to 100 MHz for the example implementation. Much higher frequency operation into the GHz range is possible with proper choice of the semiconductor manufacturing process used for the circuit implementation.

The first information path is a DC coupled level comparator which outputs a differential current depending on the relationship of the input signal level VIN to the reference threshold level VREF. The second information path is a pair of AC coupled MOS amplifiers used to transmit the high frequency content of the input signal VIN to the output VOUT. Proper combination of these two signal paths at the gates of the MOS amplifiers gives an output signal VOUT which is correct for all input frequencies below an upper speed limit.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A level translator comprising:

a comparator having a first input coupled to a voltage input VIN and a second input coupled to a reference voltage VREF, the comparator having four output terminals, a first terminal that sinks current if the voltage input VIN is greater than the reference voltage VREF, a second terminal that sinks current if the voltage input VIN is less than the reference voltage VREF, a third terminal that sources current if the voltage input VIN is greater than VREF, and a fourth terminal that sources current if the voltage input VIN is less than VREF;

a first coupling capacitive element coupled to the voltage input VIN and to the first terminal of the comparator;

a second coupling capacitive element coupled to the voltage input VIN and to the fourth terminal of the comparator;

a first transistor having drain, gate, and source terminals, the drain of the first transistor coupled to an output of the translator, the gate of the first transistor coupled to the first coupling capacitive element and to the first terminal of the comparator, the first transistor having a predetermined minimum gate to source voltage required for current conduction;

a second transistor having drain, gate, and source terminals, the drain of the second transistor coupled to an output of the translator, the gate of the first transistor coupled to the second coupling capacitive element and to the fourth terminal of the comparator, the second transistor having a predetermined minimum gate to source voltage required for current conduction, the gates of the first and second transistors being of complementary conductivity;

a first current mirror having one terminal connected to the second terminal of the comparator and a second terminal connected to the gate of the first transistor, and a third terminal connected to the source terminal of the first transistor;

a second current mirror having one terminal connected to the third terminal of the comparator, a second terminal connected to the gate of the second transistor, and a third terminal connected to the source terminal of the second transistor;

a first clamp circuit for limiting a gate voltage of the first transistor and having a first terminal connected to the gate of the first transistor and a second terminal connected to the source terminal of the first transistor; and a second clamp circuit for limiting a gate voltage of the second transistor and having a first terminal connected to the gate of the second transistor and a second terminal connected to the source terminal of the second transistor.

2. A level translator in accordance with claim 1 further comprising:

a first compensation voltage source coupled to the source terminal of the first transistor and to the third terminal of the first current mirror and to the second terminal of the first clamp circuit; and a second compensation voltage source coupled to the source terminal of the second transistor and to the third terminal of the second current mirror and to the second terminal of the second clamp circuit.

3. A level translator in accordance with claim 2 wherein the first compensation voltage source comprises a third transistor having drain, gate and source terminals, wherein the gate terminal of the third transistor is connected to the drain terminal of the third transistor, the source terminal of the third transistor is coupled to a voltage supply VDD.

4. A level translator in accordance with claim 3 the third transistor is a PMOS transistor sized so that a voltage dropped across the third transistor is sufficient to turn on the first transistor at a low value of current.

5. A level translator in accordance with claim 3 wherein the second compensation voltage source comprises a fourth transistor having drain, gate and source terminals, wherein the gate terminal of the fourth transistor is connected to the drain terminal of the fourth transistor, the source terminal of the third transistor is coupled to a voltage supply VSS.

6. A level translator in accordance with claim 3 the third transistor is a NMOS transistor sized so that a voltage dropped across the fourth transistor is sufficient to turn on the second transistor at a low value of current.

7. A level translator in accordance with claim 1 wherein the first clamp circuit comprises:

a voltage source V1; and a diode coupled in series with the voltage source V1.

8. A level translator in accordance with claim 1 wherein the first clamp circuit comprises a PMOS transistor having drain, gate and source terminals, wherein the gate terminal of the PMOS transistor is coupled to the drain terminal of the PMOS transistor so that a value of drain to source voltage controls a drain current.

9. A level translator in accordance with claim 1 wherein the second clamp circuit comprises:

a voltage source V2; and a diode coupled in series with the voltage source V2.

10. A level translator in accordance with claim 1 wherein the second clamp circuit comprises an NMOS transistor having drain, gate and source terminals, wherein the gate terminal of the NMOS transistor is coupled to the drain terminal of the NMOS transistor so that a value of drain to source voltage controls a drain current.

11. A level translator comprising:

an inverter circuit comprising:

a first field effect transistor having a first predetermined voltage threshold; and a second field effect transistor having a second predetermined voltage threshold, wherein said first and second transistors having control gates;

a first capacitor connected at one end to the gate of said first field effect transistor and at a second end to an input signal;

a second capacitor connected at one end to the gate of said second field effect transistor, the input signal being applied to a second end of said second capacitor;

a comparator circuit for detecting the values of said input signal and a reference voltage;

a first current mirror having one terminal connected to a first output of said comparator, and another terminal connected to said gate of said first field effect transistor;

a second current mirror having one terminal connected to a second output of said comparator, and another terminal connected to said gate of said second field effect transistor;

a first clamp circuit connected to a source and the gate terminal of the first field effect transistor for limiting a gate voltage of said first field effect transistor; and a second clamp circuit connected to a source and the gate terminal of the second field effect transistor for limiting a gate voltage of said second field effect transistor.

12. A level translator in accordance with claim 11 wherein the source of said first field effect transistor is connected to a first terminal of a power source, the source of said second field effect transistor is connected to a second terminal of said power source, the drains of said first and second field effect transistors are connected together and to an output terminal of the amplifier.

13. A level translator in accordance with claim 12, wherein the comparator further comprises additional output terminals connected to the gates of said first and second field effect transistors.

14. A level translator in accordance with claim 12, wherein at least one of said first and second clamp circuits comprises a MOS transistor.

15. A level translator in accordance with claim 12, wherein a third terminal of said first current mirror connects to a second terminal of said first clamp circuit and to a first terminal of a first voltage source, a third terminal of said second current mirror connects to a second terminal of said second clamp circuit and to a first terminal of a second voltage source, a second terminal of said first voltage source connects to said first terminal of said power source, and a second terminal of said second voltage source connects to said second terminal of said power source.

16. An amplifier according to claim 15, wherein at least one of said first or second voltage sources contains at least one MOS transistor.

17. A level translator comprising:

a comparator having a first input coupled to a voltage input VIN and a second input coupled to a reference voltage VREF, the comparator having four output terminals, a first terminal that sinks current if the voltage input VIN is greater than the reference voltage VREF, a second terminal that sinks current if the voltage input VIN is less than the reference voltage VREF, a third terminal that sources current if the voltage input VIN is greater than VREF, and a fourth terminal that sources current if the voltage input VIN is less than VREF;

a first coupling capacitive element coupled to the voltage input VIN and to the first terminal of the comparator;

a second coupling capacitive element coupled to the voltage input VIN and to the fourth terminal of the comparator;

a first transistor having drain, gate, and source terminals, the drain of the first transistor coupled to an output of the translator, the gate of the first transistor coupled to the first coupling capacitive element and to the first terminal of the comparator, the first transistor having a a predetermined minimum gate to source voltage required for current conduction;

a second transistor having drain, gate, and source terminals, the drain of the second transistor coupled to an output of the translator, the gate of the first transistor coupled to the second coupling capacitive element and to the fourth terminal of the comparator, the second transistor having a predetermined minimum gate to source voltage required for current conduction, the gates of the first and second transistors being of complementary conductivity;

a first current mirror having one terminal connected to the second terminal of the comparator and a second terminal connected to the gate of the first transistor, and a third terminal connected to the source terminal of the first transistor;

a second current mirror having one terminal connected to the third terminal of the comparator, a second terminal connected to the gate of the second transistor, and a third terminal connected to the source terminal of the second transistor;

a first clamp circuit for limiting a gate voltage of the first transistor and having a first terminal connected to the gate of the first transistor and a second terminal connected to the source terminal of the first transistor;

a second clamp circuit for limiting a gate voltage of the second transistor and having a first terminal connected to the gate of the second transistor and a second terminal connected to the source terminal of the second transistor;

a first compensation voltage source coupled to the source terminal of the first transistor and to the third terminal of the first current mirror and to the second terminal of the first clamp circuit; and a second compensation voltage source coupled to the source terminal of the second transistor and to the third terminal of the second current mirror and to the second terminal of the second clamp circuit.

18. A level translator in accordance with claim 17 wherein the first compensation voltage source comprises a PMOS transistor having drain, gate and source terminals, wherein the gate terminal of the third transistor is connected to the drain terminal of the third transistor, the source terminal of the third transistor is coupled to a voltage supply VDD, wherein a voltage dropped across the PMOS transistor is sufficient to turn on the first transistor at a low value of current.

19. A level translator in accordance with claim 17 wherein the second compensation voltage source comprises an NMOS transistor having drain, gate and source terminals, wherein the gate terminal of the fourth transistor is connected to the drain terminal of the fourth transistor, the source terminal of the third transistor is coupled to a voltage supply VSS, wherein a voltage dropped across the NMOS transistor is sufficient to turn on the second transistor at a low value of current.

* * * * *